(12) United States Patent
Lehmann et al.

(10) Patent No.: US 8,760,549 B2
(45) Date of Patent: Jun. 24, 2014

(54) DEMODULATION PIXEL WITH DAISY CHAIN CHARGE STORAGE SITES AND METHOD OF OPERATION THEREFOR

(75) Inventors: Michael Lehmann, Winterthur (CH); Bernhard Buttgen, Adliswil (CH)

(73) Assignee: MESA Imaging AG, Zurich (CH)

( * ) Notice: Subject to any disclaimer, the term of this patent is extended or adjusted under 35 U.S.C. 154(b) by 337 days.

(21) Appl. No.: 12/549,649

(22) Filed: Aug. 28, 2009

(65) Prior Publication Data
US 2010/0053405 A1 Mar. 4, 2010

Related U.S. Application Data

(60) Provisional application No. 61/092,548, filed on Aug. 28, 2008.

(51) Int. Cl.
  *H04N 3/14* (2006.01)
  *H04N 5/335* (2011.01)
  *H01L 27/148* (2006.01)

(52) U.S. Cl.
  USPC ............................ 348/311; 257/222; 348/294

(58) Field of Classification Search
  USPC ............................ 348/294–324; 257/213–234
  See application file for complete search history.

(56) References Cited

U.S. PATENT DOCUMENTS 3,683,193 A * 8/1972 Weimer ..................... 250/208.1
5,856,667 A    1/1999 Spirig et al.
(Continued)

FOREIGN PATENT DOCUMENTS

DE    19704496 A1    3/1998
EP    1 624 490 A1    2/2006
(Continued)

OTHER PUBLICATIONS

Buttgen B et al. Demonstration of a novel drift field pixel structure for the demodulation of modulated light waves with application in 3D image capture, Proceedings of the SPIE, Bellingham, VA; US vol. 5302, (Apr. 1, 2004) pp. 9-20.*

(Continued)

*Primary Examiner* — Timothy J Henn
*Assistant Examiner* — Pritham Prabhakher
(74) *Attorney, Agent, or Firm* — Houston & Associates, LLP

(57) ABSTRACT

A demodulation pixel architecture allows for demodulating an incoming modulated electromagnetic wave, normally visible or infrared light. It is based on a charge coupled device (CCD) line connected to a drift field structure. The drift field is exposed to the incoming light. It collects the generated charge and forces it to move to the pick-up point. At this pick-up point, the CCD element samples the charge for a given time and then shifts the charge packets further on in the daisy chain. After a certain amount of shifts, the multiple charge packets are stored in so-called integration gates, in a preferred embodiment. The number of integration gates gives the number of simultaneously available taps. When the cycle is repeated several times, the charge is accumulated in the integration gates and thus the signal-to-noise ratio increases. The architecture is flexible in the number of taps. A dump node can be attached to the CCD line for dumping charge with the same speed as the samples are taken. Different implementations are described herein, which allow for smaller design or faster speed. The pixel structure can be exploited for e.g. 3D time-of-flight imaging. Both heterodyne and homodyne measurements are possible. Due to the highly-efficient charge transport enabled by static drift fields in the photo-sensitive region and small-sized gates in the CCD chain, high frequency bandwidth from just a few Hertz (Hz) up to greater GHz is supported. Thus, the pixel allows for highly-accurate optical distance measurements. Another possible application of this pixel architecture is fluorescence lifetime imaging microscopy (FLIM), where short laser pulses for triggering the fluorescence have to be suppressed.

8 Claims, 10 Drawing Sheets

(56) References Cited

U.S. PATENT DOCUMENTS

| | | | |
|---|---|---|---|
| 6,777,659 B1* | 8/2004 | Schwarte | 250/208.1 |
| 7,498,621 B2 | 3/2009 | Seitz | |
| 8,169,522 B2* | 5/2012 | Orava et al. | 348/308 |
| 2003/0214595 A1* | 11/2003 | Mabuchi | 348/294 |
| 2006/0108611 A1* | 5/2006 | Seitz | 257/222 |
| 2008/0100736 A1* | 5/2008 | Ise | 348/311 |
| 2008/0239466 A1 | 10/2008 | Buettgen | |
| 2011/0073982 A1* | 3/2011 | Armstrong et al. | 257/460 |

FOREIGN PATENT DOCUMENTS

| | | |
|---|---|---|
| EP | 1 668 708 B1 | 10/2008 |
| GB | 2389960 A | 12/2003 |
| WO | 2006/012761 A1 | 2/2006 |

OTHER PUBLICATIONS

International Search Report mailed on Nov. 9, 2009, from counterpart International Application No. PCT/US2009/055309, filed on Aug. 28, 2009.

International Preliminary Report on Patentability mailed on Mar. 10, 2011, from counterpart International Application No. PCT/US2009/055309, filed on Aug. 28, 2009.

Buettgen, B., "Extending Time-of-Flight Optical 3D-Imaging to Extreme Operating Conditions," Ph.D. thesis, University of Neuchatel, 2006.

Buettgen, B., et al. "Demodulation Pixel Based on Static Drift Fields," IEEE Transactions on Electron Devices, 53 (11):2741-2742, Nov. 2006.

Buettgen, B., et al., "Pseudonoise Optical Modulation for Real-Time 3_d Imaging with Minimum Interference," IEEE Transactions on Circuits and Systems I: Regular Papers, vol. 54, No. 10, pp. 2109-2119, Oct. 1, 2007.

Buettgen, B., et al., "Demonstration of a novel drift field pixel structure for the demodulation of modulated light waves with application in 3D image capture," Proceedings of the SPIE, SPIE, Bellingham, VA, vol. 5302, pp. 9-20 Apr. 1, 2004.

Kawahito, S., et al., "A CMOS Time-of-Flight Range Image Sensor with Gates-on-Field-Oxide Structure," IEEE Sensors Journal, IEEE Service Center, New York, NY, vol. 7, No. 12, pp. 1578-1586, Dec. 1, 2007.

Lange, R., et al., "Time-of-flight range imaging with a custom solid-state image sensor," Laser Metrology and Inspection, Proc. SPIE, vol. 3823, Munich, 1999.

Oggier, T., et al., "An all-solid-state optical range camera for 3D real=time imaging with sub-centimeter depth resolution (SwissRanger TM)," Optical Design and Engineering, Proceedings of the SPIE, vol. 5249, pp. 534-545, 2004.

Ringbeck, Th, et al, "Dreidimensionale Objekterfassung in Echtzeit PMD Kameras erfassen pro Pixel Distanz und Helligkeit mit Videoframerate," Internet Citation, Jul. 1, 2007, pp. 1-8. Retrieved from the internet: http://www.pmdtec.com/inhalt/download/documents/200706_AVD_3DObjektvermessung.pdf.

Spirig, T., et al., "The Lock-In CCD—Two-Dimensional Synchronous Detection of Light," IEEE Journal of Quantum Electronics, vol. 31, No. 9, pp. 1705-1708, Sep. 1995.

Ushinaga, T., et al., "A QVGA-size CMOS Time-of-Flight Range Finding Sensor with Background Light Charge Draining Structure," Proceedings of the 22nd Sensor Symposium, 2005, pp. 41-44.

Van Der Tempel, W., et al, "An active demodulating pixel using a Current Assisted Photonic Demodulator implemented in 0.6 μm Standard CMOS," Group IV Photonics, 2006. 4th IEEE International Conference on Ottawa, Ontario, Canada, Sep. 13-15, 2006, pp. 116-118.

Van Nieuwenhove, D., et al., "Novel Standard CMOS Detector using Majority Current for guiding Photo-Generated Electrons towards Detecting Junctions," Proceedings Symposium IEEE/LOES Benelux Chapter, 2005.

International Search Report mailed on Sep. 11, 2009, from counterpart International Application No. PCT/US2009/055309, filed on Aug. 28, 2008.

* cited by examiner

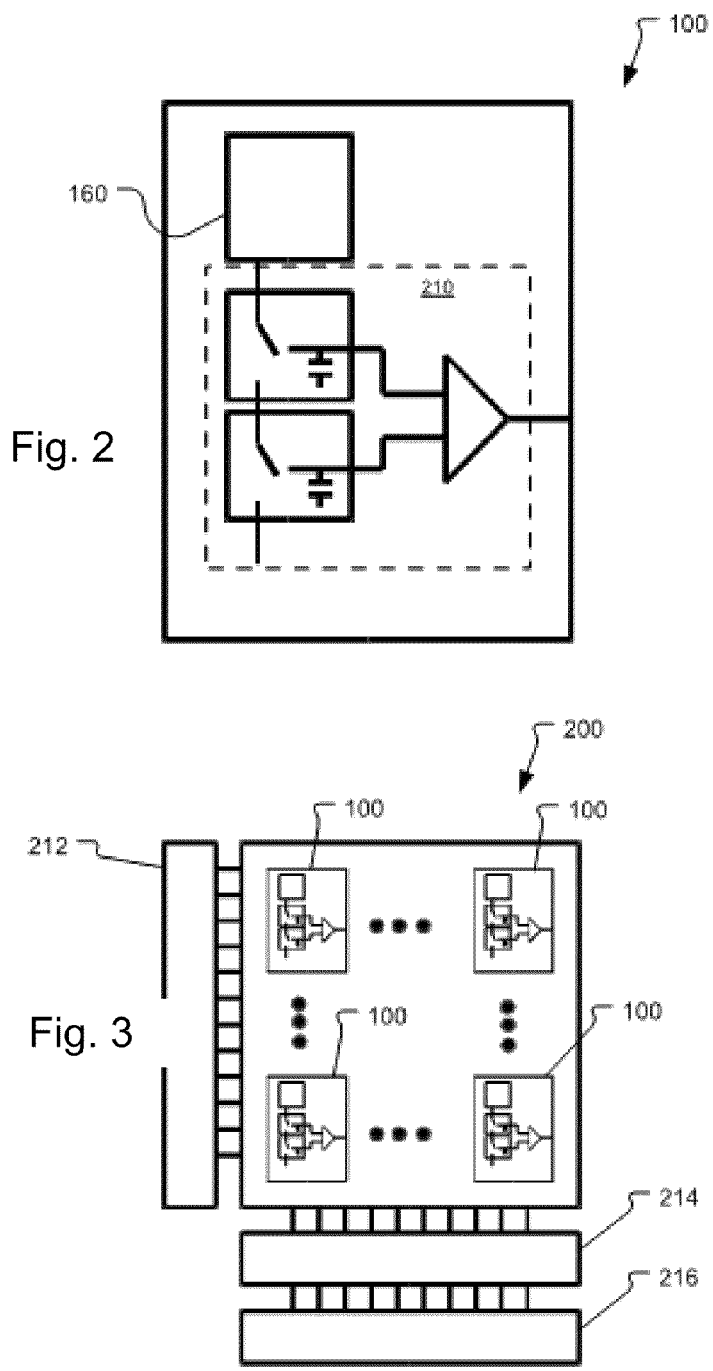

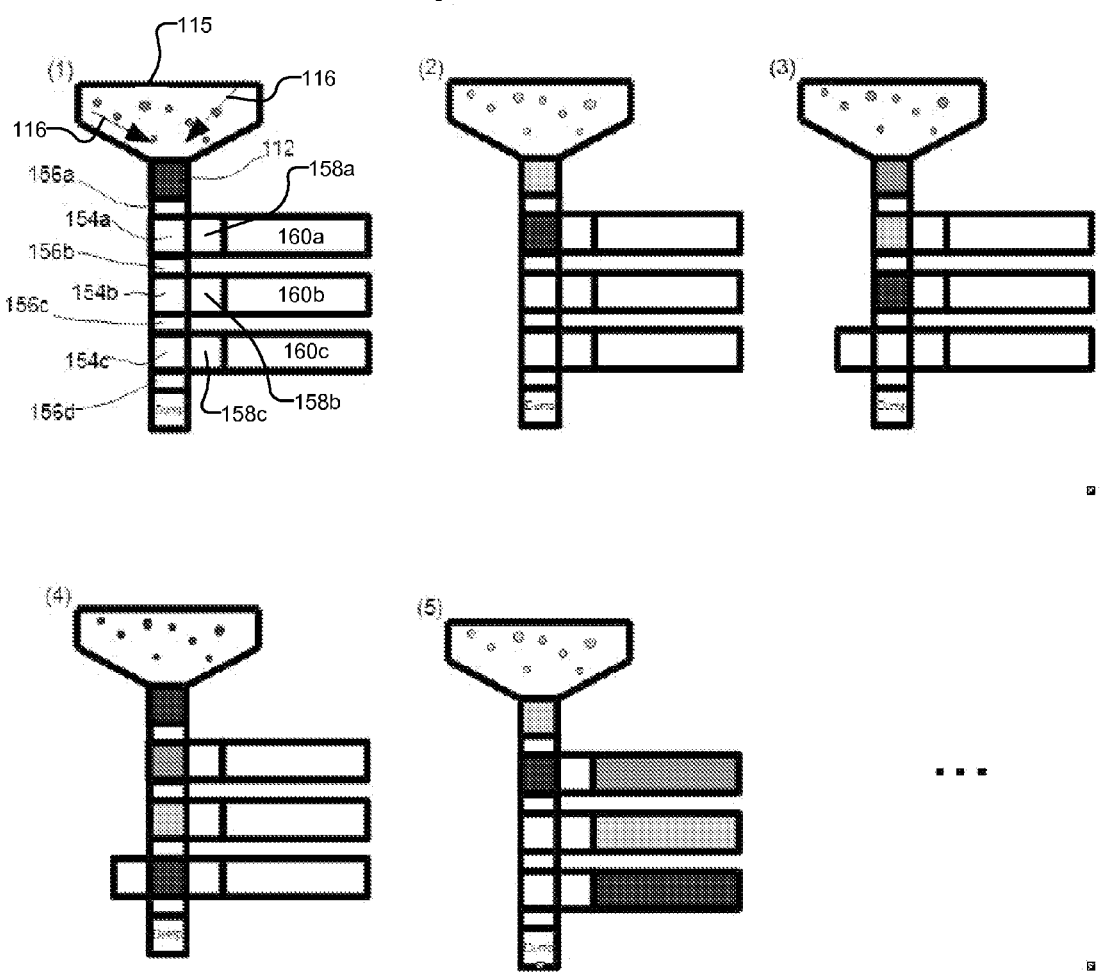

DEMODULATION PIXEL WITH DAISY CHAIN CHARGE STORAGE SITES AND METHOD OF OPERATION THEREFOR

RELATED APPLICATIONS

This application claims the benefit under 35 USC 119(e) of U.S. Provisional Application No. 61/092,548, filed on Aug. 28, 2008, which is incorporated herein by reference in its entirety.

BACKGROUND OF THE INVENTION

The demodulation of modulated light at the pixel level requires the switching of a photo-generated charge current. While possible to handle both electron as well as hole currents, the common methods today use the photo-generated electron currents. This choice is largely due to the higher mobility of electrons in the semiconductor material. Some pixel architectures do the necessary signal processing based on the photo-current while others work directly in the charge domain.

All of the pixel architectures transfer photocharges through the photo-sensitive detection region to a subsequent storage area or to a subsequent processing unit. In the case of charge-domain based pixel architectures, the photocharges are generally transferred to an integration node. In order to demodulate an optical signal, the pixel has to contain at least two integration nodes that are accumulating the photo-generated charges during different time intervals.

Different pixel concepts have been realized in the last few decades. The basic principle of an in-pixel demodulation sensor was first described in U.S. Pat. No. 5,856,667 to Thomas Spirig and Peter Seitz. Each pixel of the sensor had photo-sensitive areas and transfer gates or switches associated with each of the integration sites. The sensor enables in-pixel sampling of the impinging light signal with theoretically an arbitrary number of samples.

Another similar pixel concept was described in T. Ushinaga et al., "A QVGA-size CMOS time-of-flight range image sensor with background light charge draining structure", Three-dimensional image capture and applications VII, Proceedings of SPIE, Vol. 6056, pp. 34-41, 2006. Here, a thick field-oxide layer is used to smear the potential distribution below the demodulation gates.

A common problem of the afore-mentioned pixel architectures is the slowness of the charge transport through the semiconductor material. This decreases significantly the quality of the in-pixel demodulation process. In all pixel structures, the limiting transport speed is the step-wise potential distribution in the semiconductor substrate that is used to transport the charges through the semiconductor in lateral direction out of the photosensitive region. In those configurations, thermal diffusion dominates the transport speed instead of movement by the lateral electric drift fields resulting from the step-wise potential distribution.

More recently, new approaches to speeding the in-pixel transport of the charges have been proposed. One example by Peter Seitz and described in U.S. Pat. No. 7,498,621 B2 generates the lateral electric drift fields by passing a current through very high-resistive poly-silicon gate electrodes with the intent of producing a smoother potential distribution. Similarly, D. van Nieuwenhove et al., "Novel Standard CMOS Detector using Majority Current for guiding Photo-Generated Electrons towards Detecting Junctions", Proceedings Symposium IEEE/LEOS Benelux Chapter, 2005, introduced another drift field pixel where a drift field in the substrate is generated by the current of majority carriers. To perform demodulation of photo-generated minority carriers, the majority current is dynamically controlled by the modulation signal.

The afore-mentioned drift field pixel concepts have drawbacks, however. First, the demodulation requires the switching of large capacitances since the whole sensitive area needs to be dynamically controlled. Secondly, an electronic current is used to generate the drift fields, resulting in significant in-pixel power consumption.

An alternative pixel concept uses a static drift field pixel. The architecture described in European Patent Application EP 1 624 490 A1, entitled "Large-area pixel for use in an image sensor", overcomes these two problems. In contrast to the architectures mentioned before, it separates the detection and the demodulation regions within the pixel. It shows lower power consumption and, at the same time, it supports fast in-pixel lateral charge transport and demodulation.

One major application of demodulation pixels is found in real-time 3-D imaging. By demodulating the optical signal and applying the discrete Fourier analysis on the samples, parameters such as amplitude and phase can be extracted for the frequencies of interest. If the optical signal is sinusoidally modulated for example, the extraction based at least three discrete samples will lead to the offset, amplitude and phase information. The phase value corresponds proportionally to the sought distance value. Such a harmonic modulation scheme is often used in real-time 3-D imaging systems having incorporated the demodulation pixels.

Another possible application of these pixel architectures is fluorescence lifetime imaging microscopy (FLIM), where short laser pulses are used to trigger the fluorescence.

The precision of the pixel-wise distance measurement is directly proportional to the modulation frequency. Therefore, high-speed charge transfer from the photo-sensitive area to the storage site is of highest importance to enable high precision phase measurement.

SUMMARY OF THE INVENTION

Current demodulation pixels typically need to trade off high sampling frequencies against the number of samples taken. In most commercially available pixels, photocharges are stored in only two storage sites per pixel in order to maximize sampling frequencies. The present invention has the capability to have both a high sampling frequency and a relatively large number of samples. This is achieved by having a photosensitive region, possibly using a static drift field, in combination with a subsequent daisy chain of storage sites.

Sensors based on this pixel architecture allow for developing completely new applications, where many samples need to be acquired at very high speed. One example is submillimeter pseudo noise 3D-imaging based on the time-of-flight principle.

Embodiments of the invention can have almost an arbitrary number of sample nodes. So far, the implementation of demodulation pixels with more than two sampling storage sites were strongly hindered by the integrated circuit design layout rules restrictions. Since the demodulation region is preferably quite small compared to photo-sensitive area, in most cases the demodulation region does not offer enough space to implement the design of more than two sampling stages.

Furthermore, embodiments can reduce the problem of mismatch of the different sampling channels. The behavior mismatch of the different samples is mainly caused by the different directions of the photocharge transfer for different samples. Here, all samplings can be performed in the same direction of the semi-conductor lattice. In other words, the transfer direction does not have to be changed and, hence, the mismatch between samples is strongly reduced.

In general, according to one aspect, the invention features a pixel comprising a photosensitive region in which incoming light is converted into photocharges, a lateral drift field in the photosensitive region transporting the photocharges to a pickup point and a chain of charge storage sites that receives the photocharges from the photosensitive region at the pickup point, the photocharges corresponding to different time intervals are conveyed through successive charge storage sites of the chain.

In general, according to another aspect, the invention features a photosampling method comprising converting incoming light into photocharges, transporting the photocharges to a start of a chain of storage sites with a lateral drift field, and moving the photocharges as charge packets corresponding to different time intervals through successive charge storage sites of the chain.

In general, according to another aspect, the invention features a sensor comprising a one or two dimensional array of pixels, wherein each of the pixels comprises a photosensitive region in which incoming light is converted into photocharges and transported with a lateral drift field, and a chain of charge storage sites that receives the photocharges from the photosensitive region, the photocharges corresponding to different time intervals are conveyed through successive charge storage sites of the chain.

In general, according to another aspect, the invention features an imaging system comprising: a light source for illuminating a scene with a modulated optical signal characterized by a modulation period, and a sensor for detecting the modulated optical signal from the scene, the sensor comprising an array of pixels, each of the pixels including: a photosensitive region in which incoming light is converted into photocharges, and a chain of charge storage sites that receive the photocharges from the photosensitive region, the photocharges corresponding to different time intervals within the modulation time period are conveyed through successive charge storage sites of the chain.

In general, according to still another aspect, the invention features a pixel comprising: a photosensitive region in which incoming light is converted into photocharges, a chain of charge storage sites that receives the photocharges from the photosensitive region at the pickup point, the photocharges corresponding to different time intervals are conveyed through successive charge storage sites of the chain, and charge integration sites associated with respective charge storage sites, the photocharges being transferred from the charge storage sites to the associated charge integration sites.

In general, according to still another aspect, the invention features a photosampling method comprising: converting incoming light into photocharges, transporting the photocharges to a start of a chain of storage sites, moving the photocharges as charge packets corresponding to different time intervals through successive charge storage sites of the chain, and integrating charge packets from the same time intervals within different periods in integration sites associated with respective storage sites.

In general, according to another aspect, the invention features a sensor comprising a one or two dimensional array of pixels, wherein each of the pixels comprises: a photosensitive region in which incoming light is converted into photocharges, and a chain of charge storage sites that receives the photocharges from the photosensitive region, the photocharges corresponding to different time intervals are conveyed through successive charge storage sites of the chain, and charge integration sites associated with respective charge storage sites, the photocharges being transferred from the charge storage sites to the associated charge integration sites.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2 is a circuit diagram showing processing circuitry for the demodulation pixel;

FIG. 3 is a circuit diagram showing a sensor incorporating demodulation pixels;

DETAILED DESCRIPTION OF THE PREFERRED EMBODIMENTS

The following discussion concerns a sensor with a p-doped substrate in which electrons are the useful photo-generated charge carriers. All considerations can also be done for n-doped material, with holes as carriers of information. In this case the voltages applied to gates and/or diffusions would be reversed.

Figure 1:
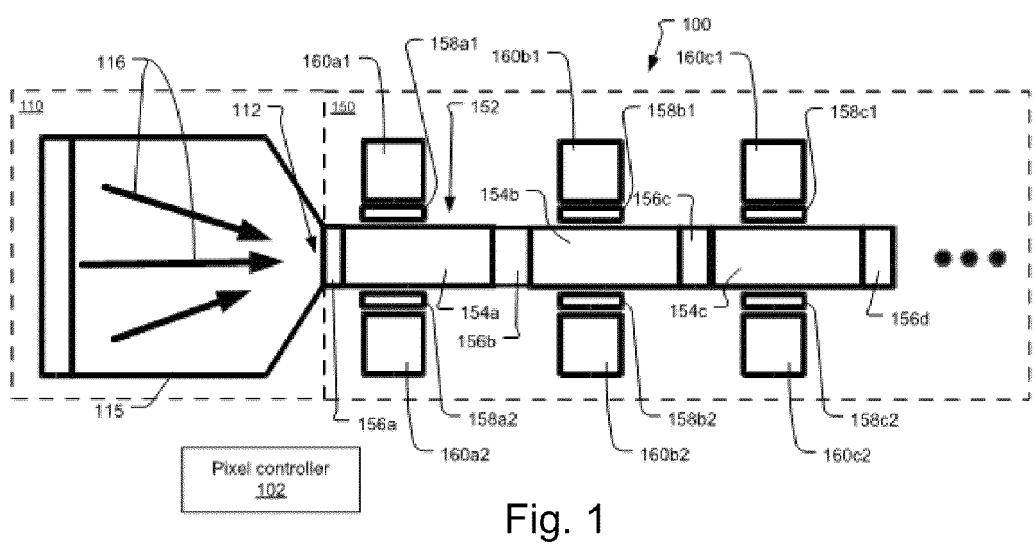
FIG. 1 is a schematic drawing of a demodulation pixel according to one embodiment of the present invention.

FIG. 1 shows a demodulation pixel 100 embodied in a semiconductor substrate that has been constructed according to the principals of the present invention.

The pixel 100 comprises a photosensitive region 110. This is typically characterized by a portion of the semiconductor substrate that receives incoming light or other radiation and is not otherwise shielded by opaque layers, such as metal, layers. The photosensitive region 110 has a photocharge transport area 115 that moves the photocharges to a pickup point 112, typically at one end of the transport area 115.

The photocharge transport area 115 transports the photocharges to the pickup point 112 typically as fast as possible in order to minimize any low-pass filtering effects on the optoelectronically converted signal. The fast charge carrier transport is realized by a lateral drift field 116. That drift field 116 can be generated by various methods. The following is an itemization of some possible methods. One realization of static drift fields is made by a photo-transparent gate of high-resistive material above the semiconductor substrate and an intervening insulator layer. The application of a potential difference generates a current flow through the gate, and hence a constant lateral electric field is created. That potential distribution is mirrored to the semiconductor substrate due to the capacitive coupling between the gate and the semiconductor so that photo-generated charges will be directed by the electric drift field. Another method to generate the lateral electric drift field within the photo-sensitive area 110 is to implement built-in drift fields. The built-in drift field can be generated by gradually changing the doping concentration through the photo-sensitive area. Other examples for generating lateral electric drift fields within the photosensitive detection region 110 of the pixel 100 are discrete gate structures, floating gates or floating diffusions, dendritic gate structures, PIN photo diodes, and majority carrier currents through the substrate. The current preferred embodiment uses overlapping gates structures to which different static potentials are applied. Combinations of the above mentioned methods to generate the lateral electric drift fields can also be implemented. The electrons generated in the drift field region are attracted by positive potentials. Therefore the gate potentials increase from the far end to the pick-up point 112. At this pick-up point all electrons are accumulated until the dedicated sampling process is finished. After that they are transported into the daisy chain 152.

More examples and description on implementations of the photocharge transport area 115, therein termed the "detection region", are provided in U.S. patent application Ser. No. 12/090,404, by Bernhard Buettgen, filed on Apr. 16, 2008, entitled Device and Method for the Demodulation of Modulated Electromagnetic Wave Fields, which is incorporated herein in its entirety by this reference.

From the pickup point 112 the photo-generated charges are transferred to a daisy chain of charge storage sites 152. This daisy chain 152 is preferably in a non-photosensitive region 150. In its implementation, the daisy chain 152 comprises a series of charge-coupled device (CCD) gates. Typically, metal layers are used to cover this region 150 to block the generation of photocharges in the substrate.

In more detail, the daisy chain 152 of storage sites, or gates, 154 comprises a first storage site 154a that is separated from the pickup point 112 by a first isolation node, or barrier gate structure, 156a. In operation the potentials applied to the isolation nodes 156 and storage sites 154 are controlled by a pixel controller 102 so that photocharges generated in the photosensitive region 110 and transported to the pickup point 112 by the lateral drift field 116 are allowed to flow through the first isolation node 156a. The pixel controller 102 raises the potential applied to the isolation node 156a so that the first charge storage site 154a contains a charge packet of photocharges that were generated in the photosensitive region 110 during a time interval. The pixel controller 102 then isolates the first charge storage site 154a from the pickup point 112 by lowering the potential applied to the isolation node 156a.

During a subsequent time interval, the charge packet contained in first storage site 154a is transferred to a second storage site 154b in the daisy chain 152. This process is accomplished by the pixel controller 102 lowering the potential applied to the first storage site 154a while raising the potential applied to the second storage site 154b and an intervening second isolation node, or barrier gate structure, 156b. The potential applied to the second isolation node 156b is thereafter lowered to isolate the second storage site 154b from the first storage site 154a. This transfer process leaves the first storage site 154a ready to receive the next charge packet associated with the next sampling time interval.

During a third time interval, the charge packet contained in second storage site 154b is transferred to a third storage site 154c and the charge packet contained in the first storage site 154a is transferred to the second storage site 154b. This process is again accomplished by the pixel controller 102 lowering the potentials applied to the upstream storage sites and isolation nodes while raising the potentials applied to the successive storage sites. The potentials applied to the isolation nodes is thereafter lowered to isolate the storage sites from each other. This transfer process again leaves the first storage site 154a ready to receive the next charge packet associated with the next sampling time interval.

In the illustrated embodiment, the daisy chain 152 is shown with a series of three storage sites 154a-154c. The illustrated pixel can be implemented with an almost arbitrary number of storage sites in the daisy chain 152, however. For sinusoid demodulation or phase determination, at least three storage sites in the daisy chain 152 is desirable. More storage sites are desirable when demodulating or determining the phase of other functions. Demodulation of n-bit pseudo noise sequences uses n-length daisy chains, where n=4 to 16, or more, in some implementations.

In the preferred embodiment, each storage site 154 has at least one associated integration site 160. The integration site is typically implemented as integration gate or diffusion. In the illustrated example, the first storage site has two integration sites 160a2, 160a2. Similarly, the second storage site has two integration sites 160b2, 160b2, and the third storage site has two integration sites 160c2, 160c2.

Each of the integration sites 160 is separated from the associated storage sites from a transfer node or gate structure 158.

In typical operation, once the daisy chain 152 has been completely filled with charge packets corresponding to a series of sampling time intervals, the charge packets are transferred from the storage sites 154 to the integration sites 160. This process is controlled by the pixel controller 102 that raises the potentials of the transfer nodes 158 while lowering the potentials of the storage sites 154. For example, to transfer the charge packet from the second storage site 154b to the integration site 160b2, the pixel controller 102 lowers the potential of the second storage site 154b, while raising the potential of the transfer gate 158b2. In this way, the photocharges from many sampling sequences are integrated together for improved signal to noise operation. That is, the process of filling the daisy chain 152 with charge packets is repeated, such as 10 or 100 or even up to 1 million times or more, with each of the integration sites 160 storing the total number of photocharges from these repeated sampling processes.

It is not mandatory that each integration site or gate 160 has its own separately controlled transfer node(s) or gate(s) 158, but it is also possible that there is one large transfer node or gate 158 for all integration sites 160 that is controlled by the pixel controller 102 with one master signal such that the charge packets are transferred out of the storage sites 154 to the integration sites 160 all together at the same time, in one implementation.

FIG. 2 shows additional circuitry associated with the pixel 100. The integration sites 160 are coupled to processing circuitry 210 implemented in each pixel 100. This circuitry 210 preferably includes analog to digital converters, subtraction elements and/or comparator circuits for determining the amount of photocharge contained in each of the integration sites 160 or the relative amount of photocharges within the integration sites 160. In other examples, the circuitry 210 determines the amount of photocharge contained in each of the storage sites 154 directly, without the necessity for the integration sites 160, especially in low noise environments. In one such example, without separate integration sites 160, the storage sites 154 are configured in a ring topology and thus the charge packets contained in the storage sites move stepwise around the ring and are successively further filled each time they are opposite the pickup point with the newly generated photocharges.

FIG. 3 shows the general implementation of the pixel architecture within the frame of a full sensor 200. Typically, sensor 200 comprises a one or two dimensional array of pixels 100. Row selection is accomplished with row decoder 212. Column selection is realized via shift registers or digital decoders. Readout circuitries include registers 214 and additional processing circuits 216.

Figure 4:
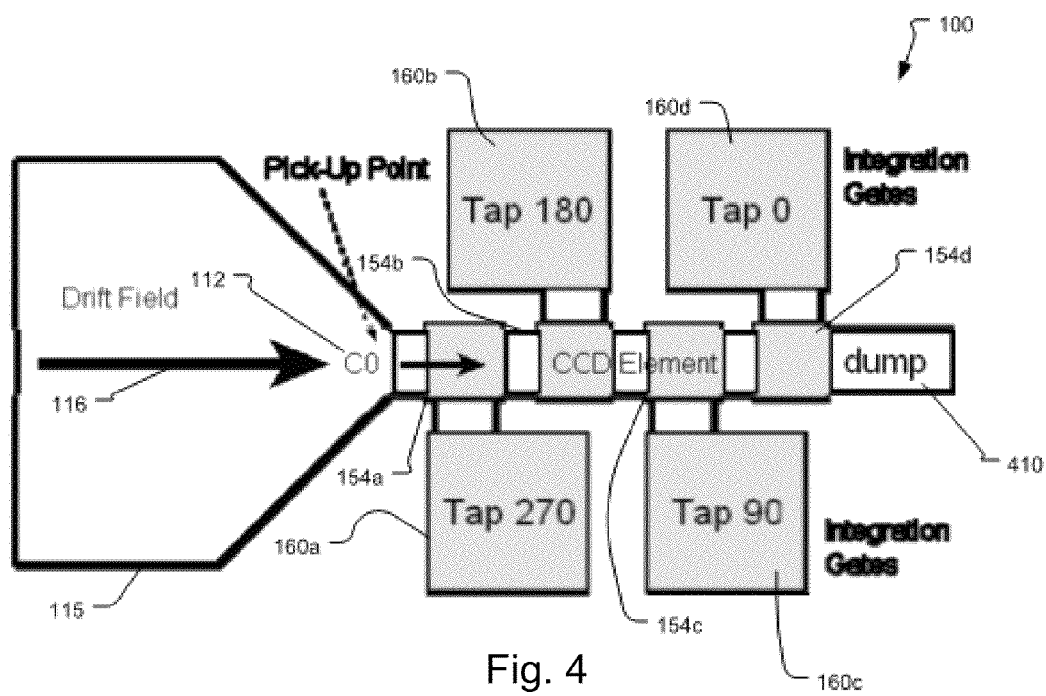
FIG. 4 is a schematic drawing of a demodulation pixel according to another embodiment of the present invention.
Figure 5A:
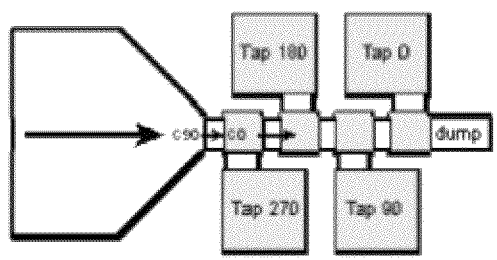
FIGS. 5a-5d show the operation of the 4-tap demodulation pixel.
Figure 5B:
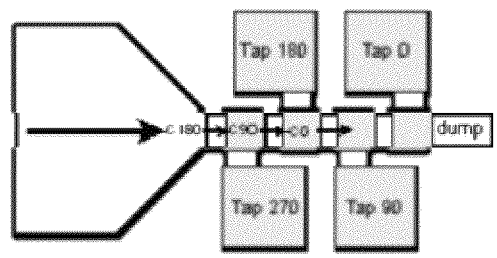
Figure 5C:
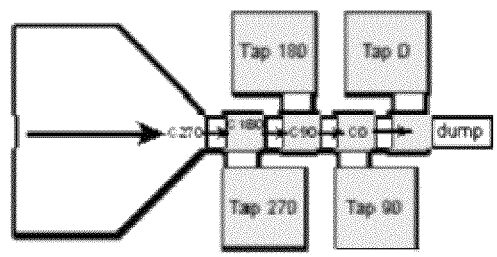
Figure 5D:
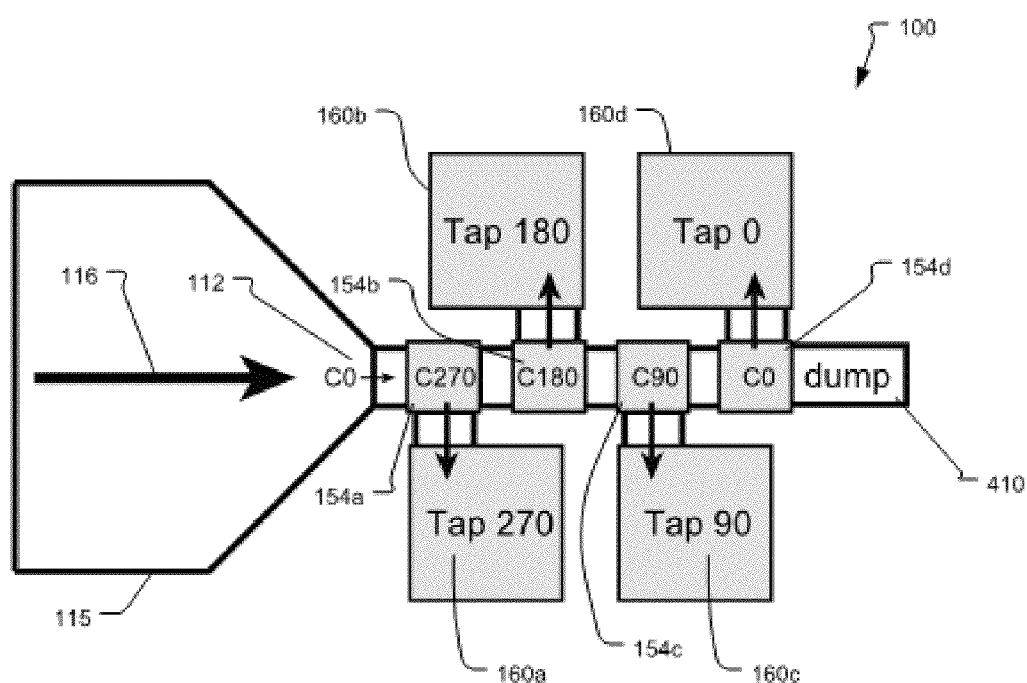

FIG. 4 illustrates one implementation of the pixel 100 based on a 4-tap architecture, which is a specific implementation of this pixel concept.

If the pixel 100 is used to sample a sinusoidally modulated light signal for time intervals corresponding to four time points, each separated by pi/2, the two upper integration sites 160$d$, 160$b$ preferably correspond to the phases 0 and 180 degrees and the bottom integration sites 160$c$, 160$a$ correspond to 90 and 270 degrees.

A dump node 410 is included at the end of the daisy chain 152. During an initial calibration or pixel reset operation, photocharges are cleared from the pixel 100 by shifting them into the dump node 410. Often these photocharges are the result of background illumination and thus constitute a noise source. The dump node does not have to be at the end of the daisy chain, however. For example, in other implementations, the dump node replaces one of the integration sites.

The whole 4-tap sampling procedure is depicted in FIGS. 4 and 5$a$-5$d$. During sampling of the optical signal, all photocharges drift to the pick-up point 112, forced by the lateral electrical drift field 116. When the sampling time or interval is finished, the photocharges are transferred into the daisy chain 152 by a normal charge-coupled device (CCD) register operation, in one implementation, as shown in FIG. 4. Then, the next charge packet can be sampled as shown in FIG. 5$a$. After each sampling step the charge packets in the CCD daisy chain 152 are shifted further as shown in FIGS. 5$b$ and 5$c$. The CCD daisy chain might be implemented e.g. as 3-phase CCD structure or as 4-phase CCD structure. This means the isolation nodes 156 each comprise a barrier gate structure of typically more than one CCD gate.

After the fourth sampling, four charge packets are within the CCD daisy chain 152, as shown in FIG. 5$d$. In order to store them, the charge packets in each of the storage sites 154$a$, 154$b$, 154$c$, 154$d$ are shifted to the integration sites 160$a$, 160$b$, 160$c$, 160$d$ dedicated to the particular signal phases. The whole 4-tap sampling is repeated several times even up to more than 1 million times and the charges accumulated within the integration sites 160$a$, 160$b$, 160$c$, 160$d$ in order to increase the signal-to-noise ratio of the demodulation process.

The dump node 410 at the right end of the CCD daisy chain 152 allows for the dumping of photocharges during the read-out phase. Basically, the design of a dump node features a flexible operation of this pixel architecture allowing for using different optical modulation techniques such as burst mode of operation or pulse mode of operation.

Figure 6B:
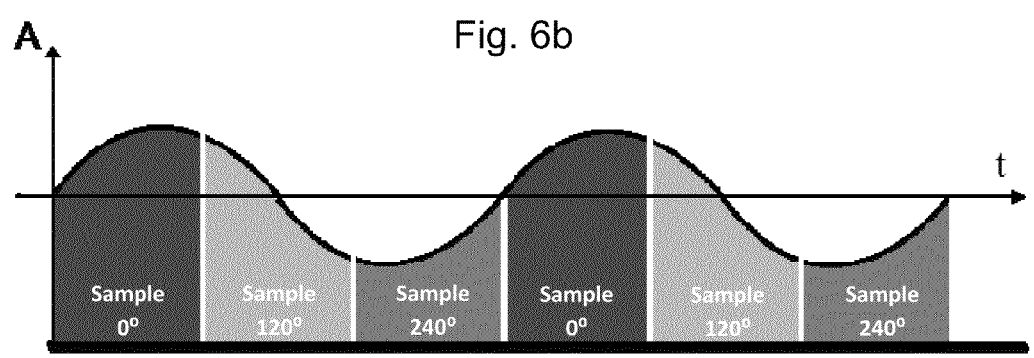
FIGS. 6a and b show the operation of the demodulation on a 3-tap pixel.

FIGS. 6$a$(1)-6$a$(5) show the demodulation principle based on a 3-tap pixel. FIG. 6$a$ illustrates the timing how the charges are first conveyed from the pick-up point 112 through the different isolation nodes 156$a$-$c$ and storage sites 154$a$-$c$ as shown in FIGS. 6$a$(1)-(4). As soon as all the storage sites 154$a$-$c$ get their charge packet FIG. 6$a$ (4), the charges are transferred below the transfer gates 158$a$-$c$ to the integration sites 160$a$-$c$ FIG. 6$a$ (5). This process can then be repeated up to more than 1 million times. Again, a dump node can be implemented to remove those electrons generated by the background light while no modulated light is emitted. Here, the daisy chain 152 can be implemented with a 3 phase CCD gate structure or a 4 phase CCD gate structure.

FIG. 6$b$ shows on the specific case of sine wave modulated system, where the impinging sine wave is sampled at three different time intervals. The photo-charges for each time interval sample are integrated once each period in the corresponding integration sites 160$a$-$c$.

Figure 7:
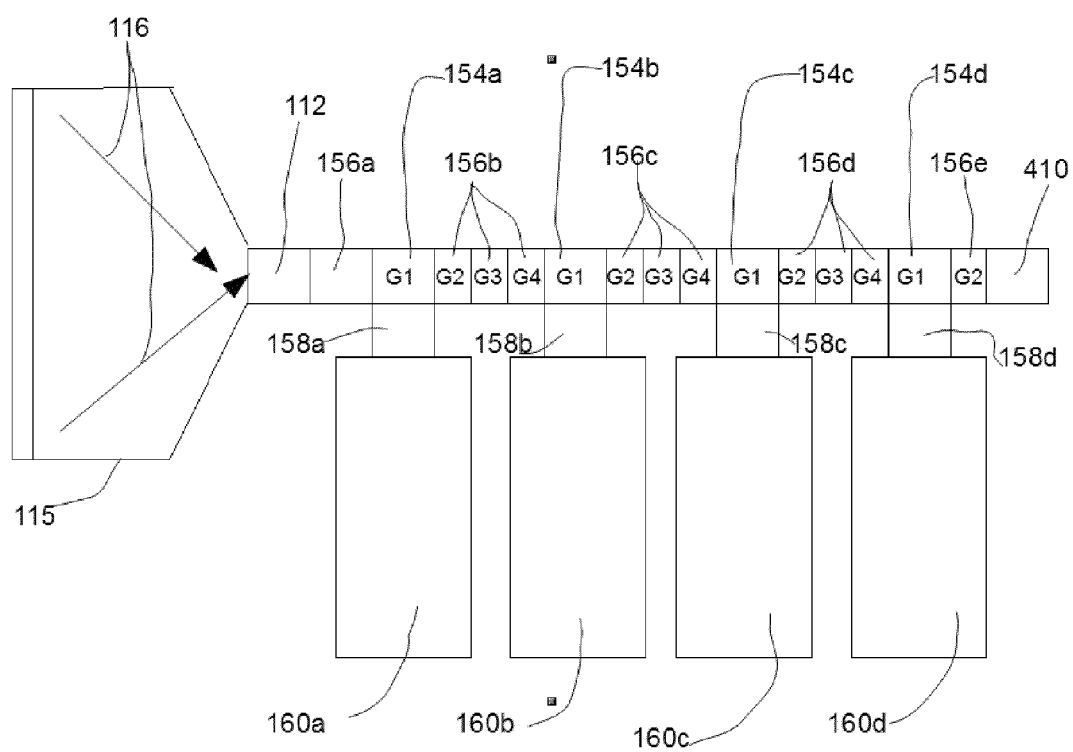
FIG. 7 is a schematic drawing of a 4-tap demodulation pixel according to another embodiment of the present invention.

FIG. 7 sketches a pixel with four integration sites 160$a$-$d$. The daisy chain is built using a 4-phase CCD gate structure principle by repeating the G1 to G4 gate array in each of the storage sites 154$a$-154$d$ and isolation nodes 156$a$-156$d$. In this case, the isolation nodes 156$a$-$d$ consists of three gates G2-G3, while the storage sites 154$a$-$d$ represents G1. A 3-phase CCD transfer gate structure can be designed similarly by e.g. removing all G4 gates from the isolation nodes 158$a$-$d$.

Embodiments of the present invention can show some significant gains compared to previous drift field pixels. In summary those are:

Design of N taps possible without decreasing the sampling performance due to the necessity of enlarging the pick-up node.

Speed of the pixels is not limited by the number of taps. It is rather determined by the size of the detection region and on the transfer speed from one to another CCD shift register. Independent on the speed, an arbitrary number of taps could be designed.

No strong impact of inclined optical incident on the sampling process is expected since all four taps experience the charge accumulation under the same gate and the transport is into the same direction.

Dump nodes can easily be integrated without leading to the requirement of switching the constant voltage used for the lateral electric drift fields.

Consideration of the Sampling Frequency

The sampling frequency is determined by the geometry of the photo-sensitive detection/drift region and by the time needed to transport the accumulated charge from one CCD register gate to the next one within the CCD daisy chain 152. Here, the sampling frequency is not influenced by the number of taps that one pixel has. More taps just add more CCD registers or storage sites 154 but do not require any change of the detection region or pick-up node.

A theoretical analysis of the maximum 3 dB-cut-off sampling frequency limited by the finite charge transport time through the detection region of any kind of demodulation pixel to the sample node can be estimated. Basically, an average transport time can be modeled, which is the sum of any drift and diffusion times of the charges until they reach the sample node. Based on the mean transport time Ttr, a 3 dB-frequency Fmax can be found as $$F\max = 7/(16\, T tr)$$

In a simplified model we can assume that there is one time component caused by charge drift Tdrift and one component Treg due to the transport through the register so that $$Ttr = Tdrift + Treg$$

The pixel design with regard to the geometry of the detection region and the CCD chain's gates needs to be accomplished in such a way that $$(Tdrift + Treg) < 7/(16\, Fdesired)$$

is fulfilled. Here Fdesired is the maximum sampling frequency that is desired to be still supported by the pixel.

As originally stated, the equation has no dependence on the number of pixel taps. The pixel can be optimized for speed by optimizing the drift time and the transport time through the CCD register. This implies at the same time, that the current system benefits from the ongoing miniaturization of semiconductor processes because smaller process feature sizes allow for shorter charge transport times.

Figure 8:
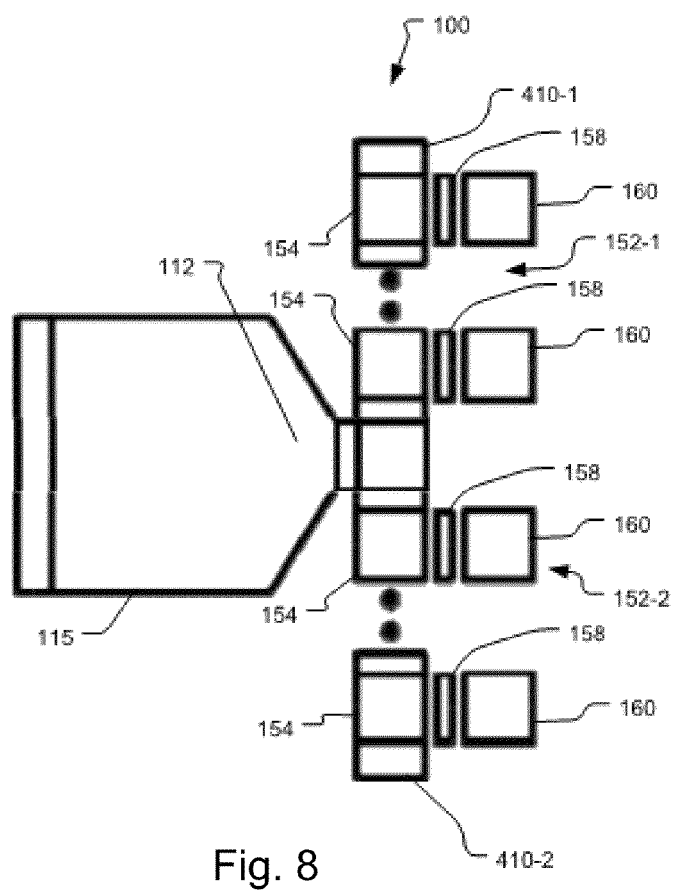
FIG. 8 is a schematic drawing of a demodulation pixel according to another embodiment of the present invention.

FIG. 8 shows an embodiment where the charge samples can be moved to one of two daisy chain segments 152-1, 152-2. Here, the transfer gates 158 and integration gates are located on only one side, resulting in advantages for routing.

Figure 9:
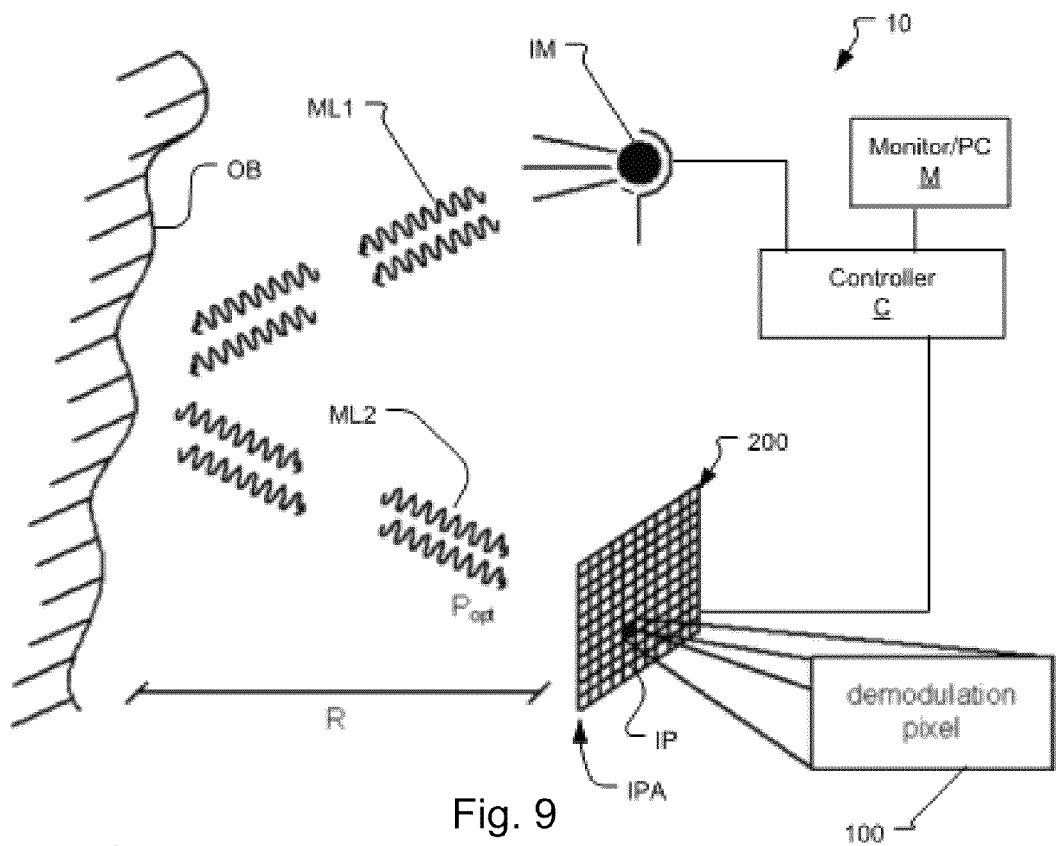
FIG. 9 shows a conventional scheme of the three-dimensional-measurement set-up using a sensor comprising demodulation pixels.

FIG. 9 illustrates the basic principle of a 3D-measurement camera system based on a sensor 200 comprising the demodulation pixels 100 described above.

Modulated illumination light ML1 from an illumination module or light source IM is sent to the object OB of a scene. A fraction of the total optical power sent out is reflected to the camera 10 and detected by the 3D imaging sensor 200. The sensor 200 comprises a two dimensional pixel matrix of the demodulation pixels 100. Each pixel 100 is capable of demodulating the impinging light signal ML2 as described above. A control board CB regulates the timing of the camera 10. The phase values of all pixels correspond to the particular distance information of the corresponding point in the scene. The two-dimension gray scale image with the distance information is converted into a three-dimensional image by image processor IP. This can be displayed to a user via display D or used as a machine vision input.

The distance R for each pixel is calculated by $$R = (c \cdot TOF)/2,$$

with c as light velocity and TOF corresponding to the time-of-flight. Either pulse intensity-modulated or continuously intensity-modulated light is sent out by the illumination module or light source IM, reflected by the object and detected by the sensor. With each pixel 100 of the sensor 200 being capable of demodulating the optical signal at the same time, the sensor is able to deliver 3D images in real-time, i.e., frame rates of up to 30 Hertz (Hz), or even more, are possible. In pulse operation the demodulation would deliver the time-of-flight directly. However, continuous sine modulation delivers the phase delay (P) between the emitted signal and the received signal, also corresponding directly to the distance R:

$$R = (P \cdot c)/(4 \cdot pi \cdot fmod),$$

where fmod is the modulation frequency of the optical signal. Typical state-of-the-art modulation frequencies range from a few MHz up to a few hundreds of MHz or even GHz.

Figure 10A:
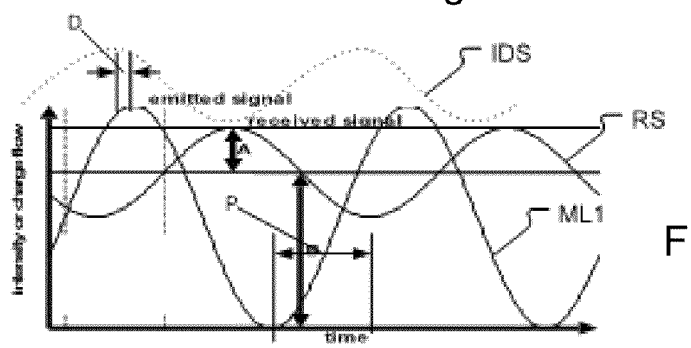
FIGS. 10a and 10b are plots representing the optical intensity and the charge flow as a function of the time for the emitted signal and the received signal, respectively, using the scheme of FIG. 8.
Figure 10B:
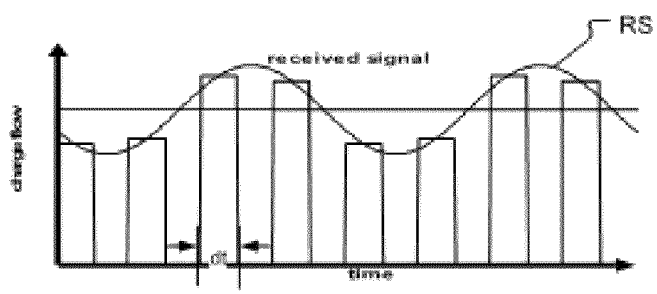

FIGS. 10a and 10b show the relationship between signals for the case of continuous sinusoidal modulation and the signal sampling. Although this specific modulation scheme is highlighted in the following, the utilization of the pixel in 3D-imaging is not restricted to this particular scheme. Any other modulation scheme is applicable: e.g. pulse, rectangular, pseudo-noise or chirp modulation. Only the final extraction of the distance information is different.

FIG. 10a shows both the modulated emitted illumination signal ES and received signal RS. The amplitude A, offset B of the received signal RS and phase P between both signals are unknown, but they can be unambiguously reconstructed with at least three samples of the received signal. BG represents the received signal part due to background light.

In FIG. 10b, a sampling with four samples per modulation period is depicted. Each sample is an integration of the electrical photo-signal in the integration gates or diffusion regions described above over a duration dt that is a predefined fraction of the modulation period. Typically, in demodulation pixels with 4 integration sites dt corresponds to a quarter of the period. In order to increase the signal to noise ratio of each sample the photo-generated charges may be accumulated over several—up to more than 1 million—modulation periods in the integration sites.

The electronic timing circuit, employing for example a field programmable gate array (FPGA), generates the signals for the synchronous channel activation in the demodulation stage.

Using these four samples, the three decisive modulation parameters amplitude A, offset B and phase shift P of the modulation signal can be extracted by the equations $$A = sqrt[(A3-A1)^2 + (A2-A1)^2]/2$$

$$B = [A0 + A1 + A2 + A3]/4$$

$$P = \arctan[(A3-A1)/(A0-A2)]$$

While this invention has been particularly shown and described with references to preferred embodiments thereof, it will be understood by those skilled in the art that various changes in form and details may be made therein without departing from the scope of the invention encompassed by the appended claims.

What is claimed is:

1. A pixel comprising:
    a photosensitive region in which incoming light, including modulated light, is converted into photocharges, a lateral drift field in the photosensitive region transporting the photocharges to a pickup point; and
    a non-photosensitive region comprising
        a chain of charge storage sites that receives the photocharges from the photosensitive region at the pickup point, wherein charge packets of the photocharges corresponding to different time intervals within a period of a modulation of the modulated light are conveyed through successive charge storage sites of the chain such that the charge packets of the photocharges are conveyed from storage site to storage site through the chain of charge storage sites, and
        charge integration sites, wherein each charge integration site is located lateral to a respective charge storage site, the photocharges being transferred from the charge storage sites to the associated charge integration sites.

2. A pixel as claimed in claim 1, wherein the lateral drift field is generated by overlapping gates structures to which different static potentials are applied.

3. A pixel as claimed in claim 1, wherein the lateral drift field is generated by built-in static drift fields.

4. A pixel as claimed in claim 1, further comprising isolation nodes for each of the storage sites that electrically separate the storage sites from each other.

5. A pixel as claimed in claim 4, wherein the charge storage sites and the isolation nodes are CCD gate structures.

6. A pixel as claimed in claim 1, wherein the photocharges are transferred from the charge storage sites to the associated charge integration sites and each of the charge integration sites is used to store photocharges generated during different modulation periods and same time intervals of a period of the modulated light.

7. A pixel as claimed in claim 1, further comprising a dump node for draining photocharges from the pixel.

8. A pixel as claimed in claim 1, further comprising a dump node at the end of the chain for draining photocharges from the pixel.

* * * * *